(12) United States Patent
Fournier

(10) Patent No.: US 7,473,950 B2
(45) Date of Patent: Jan. 6, 2009

(54) NITROGENATED CARBON ELECTRODE FOR CHALCOGENIDE DEVICE AND METHOD OF MAKING SAME

(75) Inventor: Jeffrey P. Fournier, Livonia, MI (US)

(73) Assignee: Ovonyx, Inc., Rochester Hills, MI (US)

( * ) Notice: Subject to any disclaimer, the term of this patent is extended or adjusted under 35 U.S.C. 154(b) by 242 days.

(21) Appl. No.: 11/448,184

(22) Filed: Jun. 7, 2006

(65) Prior Publication Data

US 2007/0284635 A1 Dec. 13, 2007

(51) Int. Cl.
*H01L 31/113* (2006.01)
*H01L 21/00* (2006.01)

(52) U.S. Cl. .............. 257/295; 257/E21.665; 977/741; 977/838; 365/158; 438/3

(58) Field of Classification Search .......... 438/3; 257/295, E31.665; 977/734, 741, 749, 838; 365/158

See application file for complete search history.

(56) References Cited

U.S. PATENT DOCUMENTS

| | | | |
|---|---|---|---|
| 6,423,193 B1* | 7/2002 | Miller et al. | 204/242 |
| 7,247,897 B2* | 7/2007 | Choi et al. | 257/288 |
| 2006/0046445 A1* | 3/2006 | Choi et al. | 438/513 |
| 2007/0051935 A1* | 3/2007 | Lee et al. | 257/1 |
| 2007/0147105 A1* | 6/2007 | Lung et al. | 365/148 |
| 2007/0164267 A1* | 7/2007 | Asano et al. | 257/5 |

* cited by examiner

*Primary Examiner*—W. David Coleman
(74) *Attorney, Agent, or Firm*—Honigman Miller Schwartz and Cohn LLP

(57) ABSTRACT

A nitrogenated carbon electrode suitable for use in a chalcogenide device and method of making the same are described. The electrode comprises nitrogenated carbon and is in electrical communication with a chalcogenide material. The nitrogenated carbon material may be produced by combining nitrogen and vaporized carbon in a physical vapor deposition process.

31 Claims, 4 Drawing Sheets

NITROGENATED CARBON ELECTRODE FOR CHALCOGENIDE DEVICE AND METHOD OF MAKING SAME

FIELD OF THE INVENTION

The present invention relates generally to electronic devices utilizing chalcogenide materials. In particular, the present invention relates to a composition for an electrode of a chalcogenide electronic device.

BACKGROUND

Non-volatile memory devices are used in certain applications where data must be retained when power is disconnected. Applications generally include memory cards, consumer electronics (e.g., digital camera memory), automotive (e.g., electronic odometers), and industrial applications (e.g., electronic valve parameter storage). Non-volatile memories may use phase-change memory materials, e.g., materials that can be programmed between a generally amorphous and a generally crystalline state, for electronic memory applications. This type of memory generally includes an array of memory elements, wherein each memory element defines a discrete memory location. Each memory element may include a volume of phase-change material and at least one electrode.

One type of known memory element utilizes a phase-change material that may be programmed between a generally amorphous state and generally crystalline local order. In addition, the phase-change material may be programmed between different detectable states of local order across the entire spectrum between a completely amorphous state and a completely crystalline state. These different structured states have different values of resistivity, and therefore each state can be determined by electrical sensing. Typical materials suitable for such application include those utilizing various chalcogenide materials. Unlike certain known devices, these electrical memory devices typically do not use field effect transistor devices as the memory storage element, but may comprise, in the electrical context, a monolithic body of thin film chalcogenide material. As a result, very little chip real estate is required to store a bit of information, thereby providing for inherently high density memory chips.

One characteristic common to both solid state and phase-change memory devices is significant power consumption, particularly when setting or reprogramming memory elements. Generally, the electrical energy required to produce a detectable change in resistance in these materials is approximately 100 picojoules. This amount of energy must be delivered to each of the memory elements in the solid state matrix of rows and columns of memory cells. Such high energy requirements translate into high current carrying requirements for address lines and cell isolation/access devices that are associated with each discrete memory element. Electrodes (also referred to as electrical contacts) used to supply heat to the phase-change memory material can also have a significant effect on these energy requirements. Generally, higher resistivity electrodes will generate more heat and reduce energy consumption.

Another characteristic common to both solid state and phase-change memory devices is that both have a limited reprogrammable cycle life, i.e., the number of times the device can be programmed from an amorphous state to a crystalline state, and vice versa. Further, over time the phase-change memory material can fail to reliably reprogram between an amorphous and crystalline state. Instability in the resistivity of the electrical contacts or electrodes used to supply heat to the phase-change memory material can exacerbate this reliability problem. It would be advantageous to increase the programmable cycle life of a phase-change memory material and to improve the reliability and stability of the memory devices incorporating them.

A disadvantage of known electrodes used with phase-change memory devices is that the electrodes tend to be chemically reactive with their associated phase-change material. This reactivity degrades the performance of the memory device and results in delamination of phase-change material or in a chemical compositional change to the phase-change material, which can adversely affect the device memory characteristics.

In addition, certain known electrodes used in memory devices have surfaces that are textured, uneven, or rough. Relatively thin layers (on the order of Angstroms) of insulators, electrodes, and phase-change memory materials are typically used in memory devices. Thus, an uneven electrode surface can cause the electrode to protrude through a portion of the phase-change chalcogenide material, resulting in an adverse impact on its memory characteristics.

Thus a need has arisen for an electrode and memory device that addresses one or more of the foregoing disadvantages.

SUMMARY

An embodiment of the present invention is an electronic device that comprises an electrode in electrical communication with a phase-change memory material, wherein the electrode comprises nitrogenated carbon. The electronic device may be a memory device. In one embodiment, the electrode consists essentially of nitrogenated carbon. In one embodiment, the nitrogenated carbon electrode is prepared by mixing nitrogen and vaporized carbon. In another embodiment, the vaporized carbon is produced by sputtering. In still another embodiment, the phase-change material is a chalcogenide material.

Another embodiment of the invention is an electronic device, comprising: a chalcogenide material; and an electrode in electrical communication with said chalcogenide material, said electrode comprising nitrogenated carbon. The electronic device may be a memory device. The electronic device may be a threshold switch.

Another embodiment of the invention is an electronic device, comprising: a threshold switching material; and an electrode in electrical communication with the threshold switching material. The threshold switching material may be an S-type threshold switching material. The electronic device may be a threshold switch.

Another embodiment of the invention is an electronic device, comprising: a programmable resistance material; and a nitrogenated carbon material in electrical communication with the phase-change material. The electronic device may be a memory device. The programmable resistance material may comprise a phase-change material. The programmable resistance material may comprises a chalcogenide material.

Another embodiment of the invention is an electronic device, comprising: a chalcogenide material; and a nitrogenated carbon material in electrical communication with the chalcogenide material. The electronic device may be a memory device. The electronic device may be a threshold switch.

Another embodiment of the invention is an electronic device, comprising: a threshold switching material; and a nitrogenated carbon material in electrical communication with the chalcogenide material. The threshold switching material may be an S-type threshold switching material. The electronic device may be a threshold switch.

Another embodiment of the invention is an electronic device, comprising: a phase-change material; and a first material in communication with the phase-change material, the first material consisting essentially of carbon and nitrogen. The communication may include electrical communication. The communication may include thermal communication. The electronic device may be a memory device.

Another embodiment of the invention is an electronic device, comprising: a chalcogenide material; and a first material in electrical communication with the chalcogenide material, the first material consisting essentially of carbon and nitrogen. The electronic device may be a memory device. The electronic device may be a threshold switch.

Another embodiment of the invention is a method of making an electronic device, the method comprising: forming a nitrogenated carbon material; and forming a phase-change material, the phase-change material being in electrical communication with the nitrogenated carbon material. The electronic device may be a memory device.

Another embodiment of the invention is an electronic device, comprising: a threshold switching material; and a first material in electrical communication with the chalcogenide material, the first material consisting essentially of carbon and nitrogen. The threshold switching material may be an S-type threshold switching material. The electronic device may be a threshold switch.

Another embodiment of the invention is a method of making an electronic device, the method comprising: forming a nitrogenated carbon material; and forming a chalcogenide material, the chalcogenide material being in electrical communication with the nitrogenated carbon material. The chalcogenide material may be a phase-change material. The chalcogenide material may be a threshold switching material. The electronic device may be memory device. The electronic device may be a threshold switch.

Another embodiment of the invention is a method of making an electronic device having an electrode, the method comprising providing a substrate, and mixing nitrogen gas with vaporized carbon, thereby forming the electrode on the substrate. In one embodiment, the method further comprises depositing a phase-change memory material on the electrode. In another electrode, the method further comprises depositing a threshold switching material on the electrode. The threshold switching material may be an S-type threshold switching material. The threshold switching material may be a chalcogenide threshold switching material. In another embodiment, the method further comprises depositing a chalcogenide material on the electrode. In another embodiment, the method further comprises sputtering a carbon target to produce the vaporized carbon. In yet another embodiment, the sputtering of a carbon target includes contacting the carbon target with an ionized gas, wherein the volume ratio of nitrogen gas to ionized gas is approximately thirty to seventy percent. In yet another embodiment, the electrode is a first electrode and the method further comprises depositing a second electrode on the phase-change memory material. In some embodiments, this second electrode may also comprise nitrogenated carbon. Thus, memory devices may be built with either the first electrode, second electrode, or both comprising nitrogenated carbon.

BRIEF DESCRIPTION OF THE DRAWINGS

The present embodiments will now be described, by way of example, with reference to the accompanying drawings, in which.

DETAILED DESCRIPTION

A memory device having a nitrogenated carbon electrode in electrical communication with a phase-change memory material is provided. The electrode may be prepared by combining a variable amount of nitrogen with vaporized carbon. The vaporized carbon may be generated using a physical vapor deposition process. In comparison to an electrode comprising only carbon, the nitrogenated carbon electrode may provide for improved resistivity, surface smoothness, and electrical resistivity stability.

Figure 1:
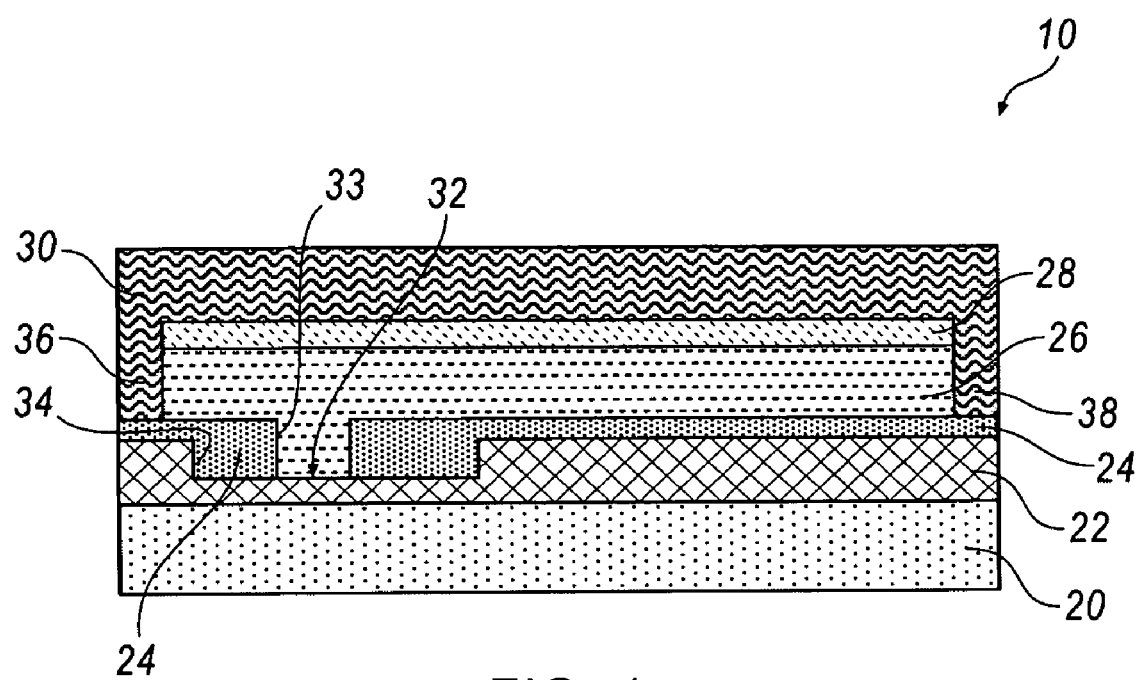
FIG. 1 is an exemplary embodiment of a memory element used to illustrate an embodiment of an electrode in accordance with the present invention.

FIG. 1 illustrates an exemplary embodiment of a memory element 10 having a discrete memory location, which may be incorporated into a memory device. As understood by one skilled in the art, the specific structure and configuration of components with respect to memory element 10 may vary depending upon the desired design characteristics of a particular memory device. Accordingly, the specific structure of memory element 10, as shown in FIG. 1, is intended to be exemplary.

Memory element 10 includes a bottom electrode 22 in electrical communication with a phase-change memory material 26. In one or more embodiments of the invention, the phase-change memory material may be programmed between two or more phases or structural states that have distinct electrical characteristics. Phase-change memory material 26 may include one or more chalcogen elements. The chalcogen elements may be either Te and Se. The phase-change material may further include one or more elements selected from the group consisting of Ge, Sb, Bi, Pb, Sn, As, S, Si, P, O, N, In, and mixtures thereof. Suitable phase-change materials include, but are not limited to, GaSb, InSb, InSe, $Sb_2Te_3$, GeTe, $Ge_2Sb_2Te_5$, InSbTe, GaSeTe, $SnSb_2Te_4$, InSbGe, AgInSbTe, (GeSn)SbTe, GeSb(SeTe), and $Te_{81}Ge_{15}Sb_2S_2$. A material that includes one or more chalcogen elements is referred to as a chalcogenide material.

The resistivity of chalcogenides generally varies by two or more orders of magnitude when the chalcogenide material changes phase from an amorphous state (more resistive) to a polycrystalline state (less resistive). In memory devices such as those incorporating the memory element 10 of FIG. 1, the electrodes deliver an electrical current to the phase-change memory material 26. As the electrical current passes through memory element 10, at least a portion of the electrical energy may be transferred to the surrounding material as heat. The electrical energy may be converted to heat energy via Joule heating. The amount of electrical energy converted to heat energy is a function of the resistivities of the electrodes and the memory material as well as the current density passing through the electrodes and the memory material.

Referring to FIG. 1, bottom electrode 22 supplies energy (e.g. electrical energy and/or heat energy) to change the state of phase-change memory material 26. Phase-change memory material 26 and bottom electrode 22 may be selected to meet the particular energy requirements of a device incorporating memory element 10. To provide predictable and stable operation of memory element 10, bottom electrode 22 may be selected to have a substantially stable resistivity over temperatures ranging from about 0° C. to about 700° C. Bottom electrode 22 may also be selected to be minimally chemically reactive with phase-change memory material 26 over this temperature range.

Referring to FIG. 1, thicknesses for bottom electrode 22 and phase-change memory material 26 may range from about 200 to 1000 Angstroms. The surface of bottom electrode 22 may be uniform and smooth so as to minimize the development of peaks that can partially protrude through phase-change memory material 26 in contact region 32, causing an adverse impact on the memory characteristics of the device. Similarly, it is desirable to avoid peaks that protrude through phase-change memory material 26 into a top electrode 28, which can result in a short circuit. Bottom electrode 22 may be constructed from a variety of materials. For example, bottom electrode 22 may be formed of one or more conductive materials. In an embodiment of the present invention, bottom electrode 22 comprises a nitrogenated carbon material. In another embodiment of present invention, bottom electrode 22 consists essentially of a nitrogenated carbon material.

An insulator 20 may be provided below bottom electrode 22. Insulator 20 is generally a dielectric material such as $SiO_2$, and may be deposited on a substrate (not shown) using a process such as chemical vapor deposition (CVD). The substrate is generally a semiconductor material like silicon. However, other substrates including, but not limited to, those containing ceramic material, organic material, or glass material as part of the infrastructure are also suitable.

Memory element 10 further includes top electrode 28 in electrical communication with phase-change memory material 26. Like bottom electrode 22, top electrode 28 may be prepared from a variety of known electrode materials. For example, top electrode 28 may be formed of one or more conductive materials. In an embodiment of the present invention, top electrode 28 comprises a nitrogenated carbon material. In another embodiment of the invention, top electrode 28 consists essentially of a nitrogenated carbon material. Insulator 30 may also be provided above top electrode 28, as shown in FIG. 1.

Figure 2:
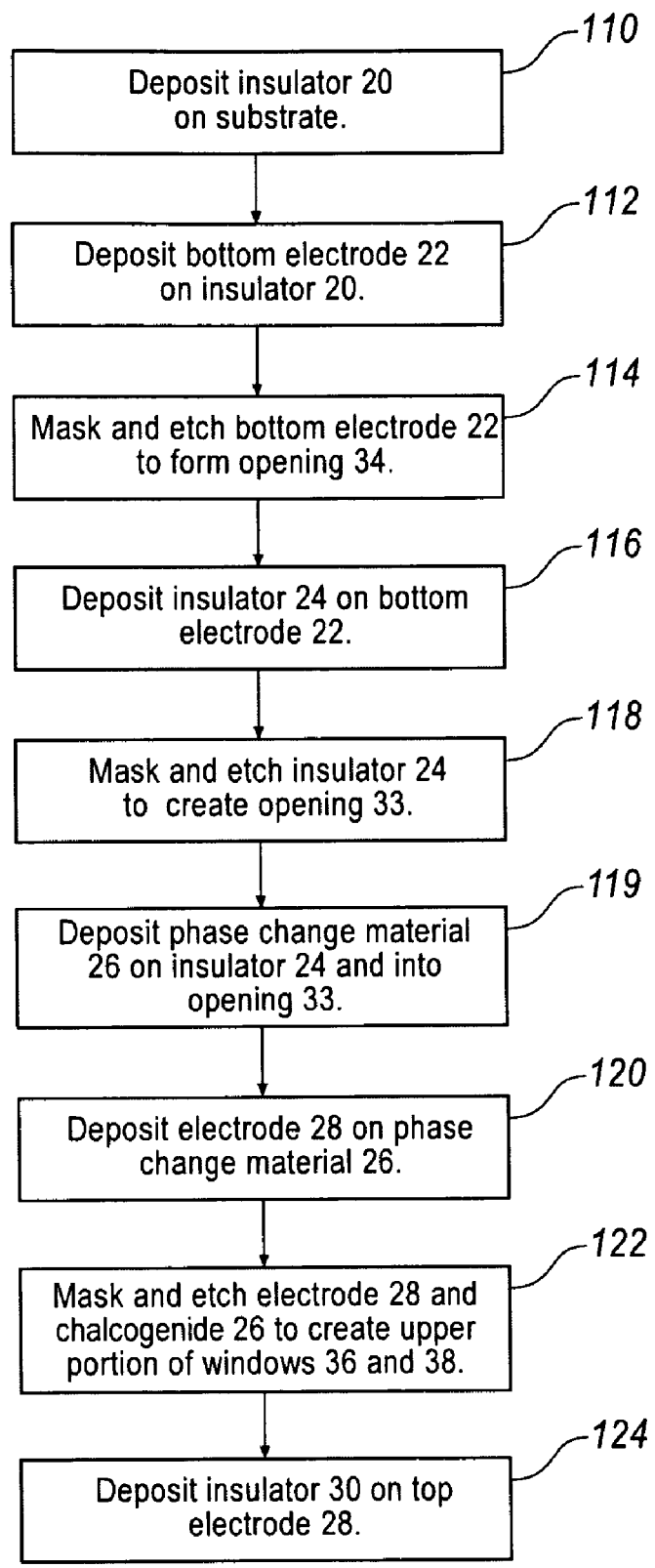
FIG. 2 is a flow chart of a method for making a memory element according to an embodiment.

FIG. 2 illustrates a flow diagram of an exemplary method for making memory element 10 of FIG. 1. At step 110, insulator 20 is deposited onto a substrate (not shown) such as a semiconductor or other known substrate using a process such as CVD. At steps 112 and 114, bottom electrode 22 is formed and subsequently masked and etched to form opening 34. Insulator 24 is then deposited at step 116 onto bottom electrode 22 using known deposition techniques such as CVD. Insulator 24 is masked and etched at step 118 to create opening 33. At step 119 a portion of phase-change memory material 26 is deposited onto insulator 24 and into opening 33 using physical vapor deposition (PVD) techniques. As shown in FIG. 1, contact area 32 is created at the interface of phase-change memory material 26 and bottom electrode 22. The size of contact area 32 and the corresponding opening 33 are directly proportional to the required amount of phase-change memory material 26. Therefore, by reducing the size of contact area 32, the required volume of phase-change memory material 26 in opening 33 is reduced, thereby reducing the total current needed to program the memory device. In an exemplary embodiment, the contact area 32 is less than approximately 0.005 $micron^2$. In another embodiment, the contact area 32 is less than approximately 0.0025 $micron^2$.

Referring again to FIG. 2, top electrode 28 is deposited at step 120 onto phase-change memory material 26. At step 122 the stack of phase-change material 26 and top electrode 28 are masked and concurrently etched to create windows 36 and 38. Finally, top insulator 30 is deposited at step 124 onto top electrode 28 such that it fills windows 36 and 38. Top electrode 28 may be formed of one or more conductive materials. Top electrode 28 may include materials such as TiW, TiAlN, carbon, and TiSiN. In an embodiment of the present invention, top electrode 28 comprises a nitrogenated carbon which may be prepared in accordance with a sputtering method as described below with respect to both bottom electrode 22 and top electrode 28. In another embodiment of the present invention, top electrode 28 consists essentially of a nitrogenated carbon which may be prepared in accordance with a sputtering method as described below with respect to both bottom electrode 22 and top electrode 28.

In one embodiment of the present invention, it is possible that bottom electrode 22 (but not top electrode 28) comprises or consists essentially of a nitrogenated carbon material. In another embodiment of the invention, it is possible that top electrode 28 (but not bottom electrode 22) comprises or consists essentially) of a nitrogenated carbon material. In another embodiment of the present invention, it is possible that both bottom electrode 22 and top electrode 28 comprise or consist essentially of a nitrogenated carbon material.

In the embodiment shown in FIG. 1, the bottom electrode 22 and the top electrode 28 are in direct physical contact with the phase-change material. In other embodiments of the invention, the bottom electrode and/or the top electrode may not be in direct physical contact with the phase-change material. Also, the carbonated nitride material of the bottom electrode 22 may or may not be in direct physical contact with the phase-change material. Also, the carbonated nitride material of the top electrode 28 may or may not be in direct physical contact with the phase-change material.

Figure 3:
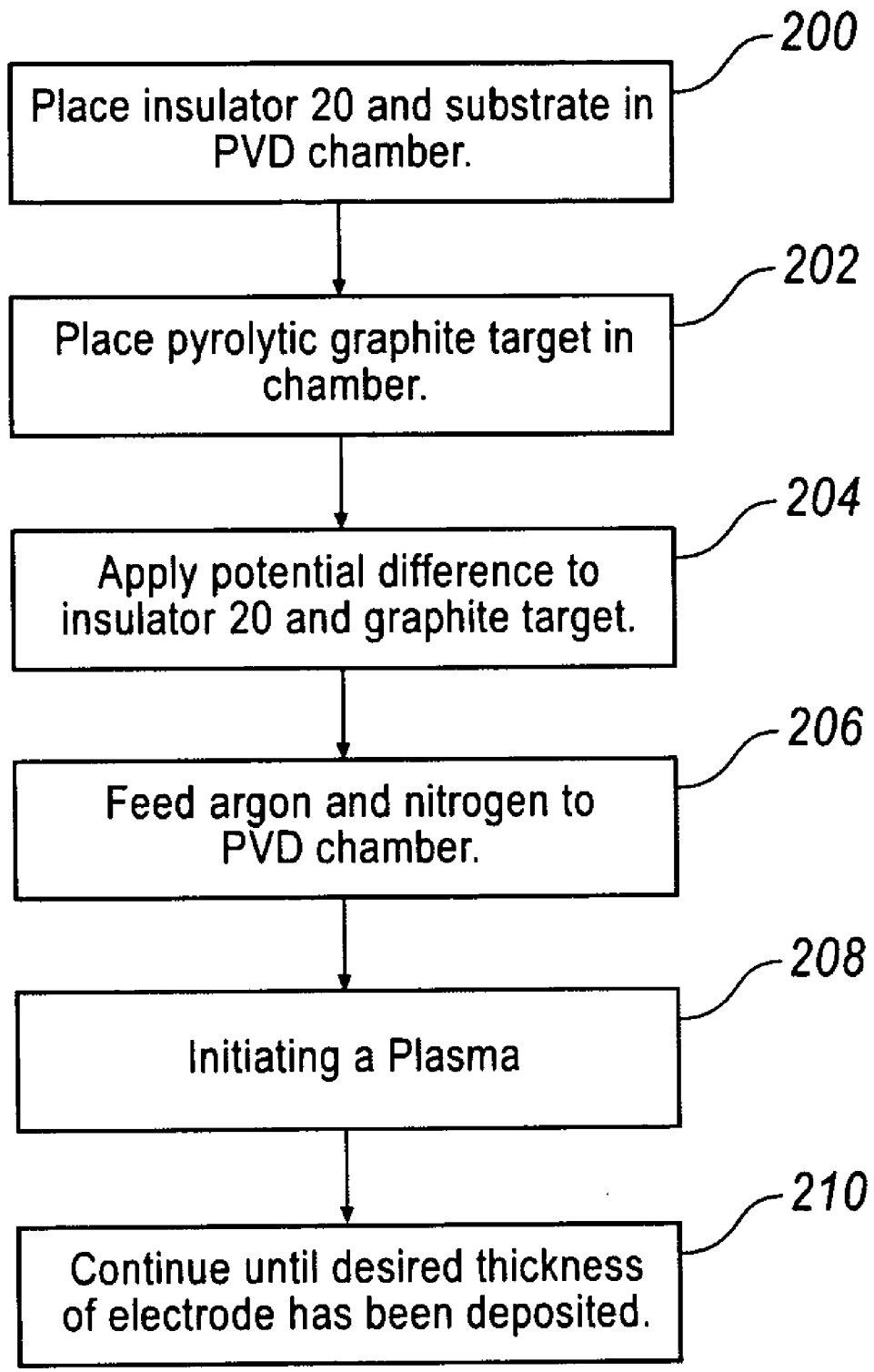
FIG. 3 is a flow chart of a method for making a nitrogenated carbon electrode according to an embodiment.

FIG. 3 shows a flow diagram illustrating an exemplary method for making bottom electrode 22 and/or top electrode 28. In steps 200 and 202 a pyrolytic graphite target is placed in a PVD vacuum chamber along with the substrate (on which insulator 20 has been previously deposited). A potential difference is applied at step 204 to the carbon target and the substrate/insulator 20 combination. As with known PVD processes, the power density (i.e. power divided by the surface area of the sputtered target in W/sq. in target area) may be adjusted. As the power density is increased, the rate of carbon vaporization and rate of deposition on the substrate also increases. The power density may range from about 20 to about 40 W/sq. in.

An ionizing gas such as, but not limited to, argon is fed into a PVD vacuum chamber at step 206. By applying the potential difference in the vacuum chamber at step 208, a plasma is initiated in which the argon gas is ionized and charged. In this way, the argon ions collide with the carbon target, releasing carbon atoms into a vapor phase. The flow rate of argon is preferably used to control the pressure in the PVD chamber. As the pressure of the argon gas increases, the amount of ionized argon available to collide with the carbon target generally increases, which increases the vaporization of carbon and its deposition rate onto the substrate. Pressures used in accordance with this embodiment generally range from about 1 to 10 milliTorr, with pressures from about 2 to 8 milliTorr being preferred. The deposition process continues until the desired electrode thickness is obtained at step 210.

For electrodes 22, 28 comprising nitrogenated carbon, step 206 further includes introducing nitrogen gas into the PVD chamber with the argon. The introduction of nitrogen provides an electrode with an increased and more stable resistivity than carbon alone. In addition, the relative feed rates of nitrogen and argon affect the resistivity of the resulting electrode and the sensitivity of the resistivity to changes in temperature. In accordance with this embodiment, nitrogen is generally fed into the vacuum chamber at a volumetric flow rate of approximately thirty to seventy percent of the volumetric flow rate of argon. In an alternative embodiment, the volumetric flow rate of nitrogen is about sixty percent of the volumetric flow rate of argon.

In comparison to known carbon electrodes, the nitrogenated carbon electrodes prepared in accordance with the foregoing methods may exhibit improved surface smoothness, higher resistivity, and more stable resistivity with temperature variation. Further, electrodes such as those described herein may be subjected to further processing, such as rapid thermal annealing. Unlike pure carbon electrodes, electrodes prepared in accordance with the foregoing methods may maintain relatively higher resistivities even after annealing at temperatures from about 400° C. to about 700° C.

Referring again to FIG. 1, bottom electrode 22 and/or top electrode 28 may comprise a nitrogenated carbon material. If both the bottom and top electrodes comprise a nitrogenated carbon material, then the nitrogenated carbon material of the bottom electrode may be the same as or may be different from the nitrogenated carbon material of the top electrode. Hence, the nitrogenated carbon material of the bottom electrode and the nitrogenated carbon material of the top electrode may have the same composition or they may have different compositions.

The nitrogenated carbon material of the bottom electrode and/or top electrode may be prepared by combining nitrogen gas and vaporized carbon. The carbon component used to form the electrodes may be vaporized by a variety of known techniques, such as physical vapor deposition (PVD), chemical vapor deposition (CVD), and plasma enhanced CVD. However, it is preferably vaporized by sputtering a carbon target with an ionized gas in accordance with the preceding method. Because electrode 22 and/or electrode 28 are deposition products formed by mixing nitrogen gas and vaporized carbon, they may have a substantially uniform composition along its thickness, resulting in generally uniform electrical characteristics throughout.

With respect to the method of FIG. 3, the relative feed rates of nitrogen and argon in a carbon sputtering process can have an effect on the resistivity of the resulting electrode. To illustrate this effect, several examples of electrodes prepared in accordance with the foregoing methods will now be described. Each of the electrodes was prepared by sputtering a 75 sq. in. pyrolytic graphite target with argon. Power density was held constant at 27 Watt/sq. in. Pressure was maintained at 2 milliTorr, and the argon flow rate was held at 20 standard cubic centimeters per minute. Starting with pure carbon as a control, a series of electrodes was prepared by adding various flow rates of nitrogen to the PVD chamber. Electrode resistivities were measured in the as-deposited state and after rapid thermal annealing for one minute at 450° C., 500° C., and 700° C. each. The results are set forth below in Table 1.

TABLE 1

| $N_2$/Argon volumetric ratio (sccm/sccm) × 100 (%) | Resistivities (ohm-cm) | | | |
|---|---|---|---|---|
| | As-deposited | 450° C. | 500° C. | 700° C. |
| 0 | 0.696 | 0.0319 | 0.0212 | 0.00595 |
| 10 | 0.3360 | 0.0289 | 0.0213 | 0.00779 |
| 20 | 0.174 | 0.0275 | 0.027 | 0.0135 |
| 30 | 0.690 | 0.118 | 0.0954 | 0.0516 |
| 40 | 0.662 | 0.266 | 0.0984 | 0.0867 |
| 50 | 2.27 | 0.536 | 0.439 | 0.293 |
| 60 | 1.30 | 0.354 | 0.302 | 0.325 |

As the data indicates, after annealing, the electrode made with pure carbon (i.e., 0% nitrogen) experienced a significant drop in resistivity. Its resistivity also showed a greater than 80 percent drop as the annealing temperature was varied from 450° C. to 700° C. In contrast, the nitrogenated electrodes showed a more stable resistivity when subjected to the various annealing temperatures, with the 60% nitrogen/argon electrode yielding a resistivity percentage change of only about 8 percent between 450° C. and 700° C.

In another embodiment of the invention, an electrode comprising nitrogenated carbon (or consisting essentially of nitrogenated carbon) may be prepared by sputtering (e.g. physical vapor deposition) a target comprising both carbon and nitrogen. In an embodiment of the invention, an electrode may be formed by sputtering a target that consists essentially of the elements carbon and nitrogen. In one embodiment of the invention, the atomic percent of the carbon (of the target) may be greater than the atomic percent of the nitrogen (of the target). In an embodiment, the atomic percent of the carbon may be greater than about 50% while the atomic percent of the nitrogen may be less than about 50%. In another embodiment, the atomic percent of the carbon may be greater than or equal to about 60% while the atomic percent of the nitrogen may be less than or equal to about 40%. In another embodiment, the atomic percent of the carbon may be greater than or equal to about 70% while the atomic percent of the nitrogen may be less than or equal to about 30%. In another embodiment, the atomic percent of the carbon may be greater than or equal to about 80% while the atomic percent of the nitrogen may be less than or equal to about 20%. In another embodiment, the atomic percent of the carbon may be greater than or equal to about 85% while the atomic percent of the nitrogen may be less than or equal to about 15%. In another embodiment, the atomic percent of the carbon may be greater than or equal to about 90% while the atomic percent of the nitrogen may be less than or equal to about 10%. In an embodiment, the atomic percent of the carbon may be greater than or equal to about 95% while the atomic percent of the nitrogen may be less than or equal to about 5%. In another embodiment, the atomic percent of the carbon may be between about 90% and 95% while the atomic percent of the nitrogen may be between about 10% and 5%. In one example, the target consists essentially of carbon and nitrogen where the atomic percent of carbon is about 93% while the atomic percent of nitrogen is about 7%. In an embodiment of the invention, the target may comprise a carbon nitride material. In an embodiment of the invention, the target may consist essentially of a carbon nitride material.

Referring again to FIG. 1, in one or more embodiments of the invention, electrode 22 and/or the electrode 28 may comprise an electrode material wherein the electrode material consists essentially of the elements carbon and nitrogen. In one or more additional embodiments of the invention, electrode 22 and/or the electrode 28 may consist essentially of an electrode material wherein the electrode material consists essentially of the elements carbon and nitrogen. For example, electrode 22 (and/or electrode 28) may be formed as a layer of electrode material where the electrode material consists essentially of the elements carbon and nitrogen. In one embodiment of the invention, the atomic percent of the carbon (of the electrode material) may be greater than the atomic percent of the nitrogen (of the electrode material). In an embodiment, the atomic percent of the carbon may be greater than about 50% while the atomic percent of the nitrogen may be less than about 50%. In another embodiment, the atomic percent of the carbon may be greater than or equal to about 60% while the atomic percent of the nitrogen may be less than or equal to about 40%. In another embodiment, the atomic percent of the carbon may be greater than or equal to about 70% while the atomic percent of the nitrogen may be less than or equal to about 30%. In another embodiment, the atomic percent of the carbon may be greater than or equal to about 80% while the atomic percent of the nitrogen may be less than or equal to about 20%. In another embodiment, the atomic percent of the carbon may be greater or equal to about 90% while the atomic percent of the nitrogen may be less than or equal to about 10%. In another embodiment, the atomic percent of the carbon may be greater than or equal to about 95% while the atomic percent of the carbon may be less than or equal to about 5%. In another embodiment, the atomic percent of the nitrogen may be greater than about 5% while the atomic percent of the carbon is less than 95%. In another embodiment, the atomic percent of the carbon may be between about 90% and 95% while the atomic percent of the nitrogen may be between about 10% and 5%. In one example, the electrode material consists essentially of carbon and nitrogen where the atomic percent of the carbon is about 93% while the atomic percent of the nitrogen is about 7%. It is noted that increasing the atomic percent of the nitrogen may increase the resistivity of the electrode material while decreasing the atomic percent of the nitrogen may decrease the resistivity of the electrode material.

In an embodiment of the invention, the electrode material may be a carbon nitride material. Hence, in an embodiment of the invention, at least one of the electrodes of the memory device (for example, electrode 22 and/or electrode 28 shown in FIG. 1) may comprise a carbon nitride material. In another embodiment of the invention, at least one of the electrodes of the memory device (for example, electrode 22 and/or electrode 28 shown in FIG. 1) may consist essentially of a carbon nitride material. As an example, electrode 22 and/or electrode 28 may be formed as a layer of carbon nitride material.

In an embodiment of the invention, an electrode material consisting essentially of carbon and nitrogen may be in direct physical contact with the phase-change material. In another embodiment of the invention, an electrode material consisting essentially of carbon and nitrogen may be in electrical communication with the phase-change material but not be in direct physical contact with the phase-change material.

Additional conceivable device structures are described, without limitation, in U.S. Pat. No. RE37,259, U.S. Pat. No. 6,031,287, U.S. Pat. No. 6,617,192, U.S. Pat. No. 6,943,365, U.S. Pat. No. 6,969,866, U.S. Pat. No. 6,969,869 and U.S. Pat. No. 6,972,428 which are all hereby incorporated by reference herein.

The electrodes and electrode materials described herein (as well as the methods for preparing the electrodes and electrode materials as described herein) may be used in combination with any programmable resistance material capable of being programmed between two or more resistance states. In one embodiment, the programmable resistance material may be a phase-change material. In another embodiment of the invention, the programmable resistance material may not be a phase-change material. In an embodiment of the invention, the programmable resistance material may be programmed among three or more resistance states.

The electrodes and the electrode materials described herein (as well as the methods for making the electrodes and electrode materials described herein) may be used in combination with threshold switching materials to form threshold switches. Examples of threshold switching materials include chalcogenide threshold switching materials. An example of a chalcogenide threshold switching material is the alloy $Si_{14}Te_{39}As_{37}Ge_9X_1$ where X may, for example, be the element In (indium) or the element P (phosphorous). In one or more embodiments of the invention, the chalcogenide threshold switching material is in an amorphous state. In one or more embodiments of the invention, the chalcogenide threshold switching material does not crystallize with the addition of energy. In one or more embodiments of the invention, the chalcogenide threshold switching material is not a phase-change material.

The chalcogenide threshold switching material may be used in combination with one or more electrodes (preferably two or more electrodes) to form a chalcogenide threshold switch (also referred to as a chalcogenide threshold switching device or a chalcogenide threshold switching element).

Figure 4:
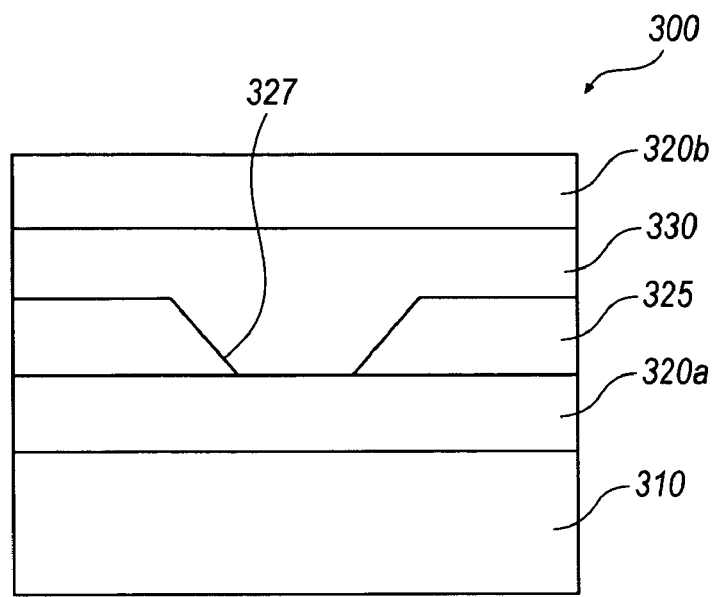
FIG. 4 is an exemplary embodiment of a threshold switch.

An example of a chalcogenide threshold switch using two electrodes is shown in FIG. 4. FIG. 4 shows a chalcogenide threshold switch 300 comprising a bottom electrode 320A, a chalcogenide threshold switching material 330 and a top electrode 320B. The bottom electrode is formed over a substrate 310. A dielectric material 325 is formed over the bottom electrode 320A. A opening 327 is formed in dielectric bottom electrode 320A and a top electrode 320B formed over the chalcogenide threshold switching material 330. The threshold switch 300 is formed over a substrate 310. A threshold switch using two electrodes may be referred to as a two terminal threshold switch. In other embodiments of the invention, it is conceivable that the chalcogenide threshold switch has more than two electrodes.

Associated with a chalcogenide threshold switch is a current-voltage, or "I-V", characteristic curve. The I-V characteristic curve describes the relationship between the current through the threshold switch as a function of the voltage across the threshold switch.

Figure 5:
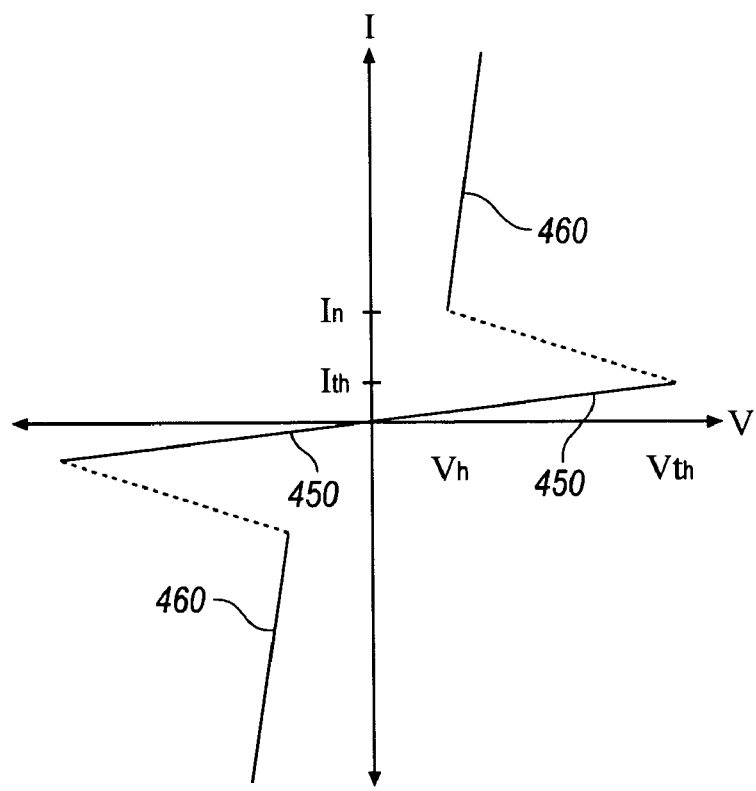
FIG. 5 is an example of the current-voltage characteristics of a chalcogenide threshold switch.

An example of an I-V characteristic curve for a chalcogenide threshold switch (such as a two terminal chalcogenide threshold switch) is shown in FIG. 5. FIG. 5 shows the I-V plot in both the first quadrant (where voltages and currents are positive) and the third quadrant (where voltages and currents are negative). While only the first quadrant is described below, an analogous description applies to the curve in the third quadrant of the I-V plot (where the voltage and the current are both negative).

The I-V characteristic curve includes an "off-state" branch 450 and an "on-state" branch 460. The off-state branch 450 corresponds to the branch in which the current passing through the threshold switch increases slightly upon increasing the voltage applied across the threshold switch. This branch exhibits a small slope in the I-V plot and appears as a nearly horizontal line in the first (and third) quadrant of FIG. 5. The on-state branch 460 corresponds to the branch in which the current passing through the threshold switch increases significantly upon increasing the voltage applied across the threshold switch. The magnitude of the slope of the on-state branch is greater than the magnitude of the slope of the off-state branch. In the example shown in FIG. 5, the on-state branch exhibits a large slope in the I-V plot and appears as a substantially vertical line in the first (and third) quadrant of FIG. 5. The slopes of the off-state and on-state branches shown in FIG. 5 are illustrative and not intended to be limiting. Regardless of the actual slopes, the on-state branch exhibits a steeper slope than the off-state branch. Hence, the off-state branch corresponds to a relatively high resistance condition of the threshold switch. The on-state branch corresponds to a relatively low resistance condition of the threshold switch.

When conditions are such that the current through the threshold switch and voltage across the switch is described by a point on the off-state branch of the I-V curve, the threshold switch is said to be in the "OFF" state. Likewise, when conditions are such that the current through the threshold switch and voltage across the threshold switch is described by a point on the on-state branch of the I-V curve, the threshold switch is said to be in the "ON" state. The resistance of the threshold switch in the OFF state is higher than the resistance of the threshold switch in the ON state.

The switching properties of the threshold switch can be described by reference to FIG. 5. When no voltage is applied across the threshold switch, the threshold switch is in the "OFF" state and no current flows. This condition corresponds to the origin of the I-V plot shown in FIG. 5 (current=0, voltage=0). The threshold switch remains in the OFF state as the voltage across the threshold switch and the current through the threshold switch is increased, up to a voltage $V_{th}$ which is referred to as the "threshold voltage" of the threshold switch. When the voltage across the threshold switch is less than $V_{th}$, the slope of the off-state branch of the I-V curve is small and the current flowing through the threshold switch increases only in a small amount as the applied voltage is increased. It is noted that the current $I_{th}$ is referred to as the threshold current and is the current that corresponds to the threshold voltage.

When the applied voltage across the threshold switch equals or exceeds the threshold voltage $V_{th}$, the threshold switch switches from the off-state branch 450 to the on-state branch 460 of the I-V curve. The switching event occurs instantaneously and is depicted by the dashed line in FIG. 5. Upon switching, the voltage across the threshold switch decreases significantly and the current through the threshold switch becomes much more sensitive to changes in the device voltage (hence, branch 460 is steeper than branch 450). The threshold switch remains in the on-state branch 460 as long as a minimum current, labeled $I_h$ in FIG. 5, is maintained. $I_h$ is referred to as the holding current of the threshold switch and the associated voltage $V_h$ is referred to as the holding voltage of the threshold switch. If the threshold switch conditions are changed so that the current becomes less than $I_h$, the threshold switch normally returns to the off-state branch 450 of the I-V plot and requires re-application of a voltage which is greater than or equal to the threshold voltage $V_{th}$ to resume operation on the on-state branch. If the current is only momentarily (a time less than the recovery time of the chalcogenide threshold switching material) reduced below $I_h$, the ON state of the threshold switch may be recovered upon restoring the current through the threshold switch which is at or above $I_h$.

Analogous switching behavior occurs in the third quadrant of the I-V plot shown in FIG. 5. Provided one is aware of the negative polarities of both the voltage and current of the I-V curve in the third quadrant, the switching behavior in the third quadrant is analogous to that described hereinabove for the first quadrant. For example, applied voltages having a magnitude greater than the magnitude of the negative threshold voltage in the third quadrant induce switching from the off-state branch 450 to the on-state branch 460.

Hence, as described above, the chalcogenide threshold switch may be switched from an OFF state to an ON state by application of a voltage across the threshold switch having a magnitude which is greater than or equal to the magnitude of the threshold voltage $V_{th}$. While not wishing to be bound by theory, it is believed that application of a voltage across the threshold switch which is at or above the threshold voltage may cause the formation of a conductive channel or filament within the threshold switching material. At the threshold voltage $V_{th}$, the electric field experienced by the threshold switching material is sufficiently high to induce a breakdown or avalanche effect whereby electrons are removed from atoms to form a highly conductive, plasma-like filament of charge carriers. Rather than being bound to atoms, some electrons become unbound and highly mobile. As a result, a conductive channel or filament forms. The conductive filament constitutes a conductive volume within the otherwise resistive chalcogenide threshold switching material. The conductive filament extends through the chalcogenide threshold switching material and provides a low resistance pathway for electrical current. Portions of the chalcogenide material outside of the filament remain resistive. Since electric current traverses the path of least resistance, the presence of a conductive filament renders the chalcogenide threshold switching material more conductive and establishes an "ON" state. The creation of a conductive filament is the event that underlies the switching of the threshold switch from its OFF state to its ON state.

It is noted that in one or more embodiments of the invention, the chalcogenide threshold switching material (which may be in an amorphous state) does not crystallize with the addition of energy. In one or more embodiments of the invention, the threshold switching material is not a phase-change material.

It is noted that the current-voltage characteristic curve shown in FIG. 5 is an example of an S-type current-voltage characteristic curve. A threshold switch exhibiting this current-voltage behavior is referred to as an S-type threshold switch. Likewise, the corresponding threshold switching material is referred to as S-type threshold switching material. It is possible that any threshold switching material that exhibits similar S-type current-voltage characteristics may be used as the threshold switching material. In one embodiment, the S-type threshold switching material may be chalcogenide material. In another embodiment, the S-type threshold switching material may not be a chalcogenide material.

All of the electrode materials described herein may be used for an electrode of a threshold switch (such as a chalcogenide threshold switch or an S-type threshold switch). The disclosure herein with regards to the composition of electrodes 22 and 28 shown in FIG. 1 is applicable to electrodes used for threshold switches (such as chalcogenide threshold switches and S-type threshold switches).

Referring again to FIG. 4, it is noted that electrode 310A and/or electrode 310B may be formed of any of the electrode materials described herein. For example, in one or more embodiments of the invention, electrode 310A and/or electrode 310B may comprise (or may consist essentially of) a nitrogenated carbon material. The nitrogenated carbon material may or may not be in direct contact with the threshold switching material. Likewise, in one or more embodiments of the invention, electrode 310A and/or electrode 310B may comprise (or may consist essentially of) an electrode material where the electrode material consists essentially of the elements carbon and nitrogen. In one embodiment, the atomic percent of the carbon is greater than the atomic percent of the nitrogen. In other embodiments of the invention, the atomic percentages of the carbon and the nitrogen may be varied as described herein. In the embodiment shown in FIG. 4, the electrodes 310A and 310B are shown to be in direct physical contact with the chalcogenide threshold switching material. In other embodiments of the invention, one or both of the electrodes may not be in direct physical contact with the threshold switching material.

It is further noted that all of the methods described herein for making the electrodes and electrode materials (such as the carbonated nitride electrode materials) may be used in combination with threshold switching materials (such as chalcogenide threshold switching materials and S-type threshold switching materials).

While the present invention has been particularly shown and described with reference to the foregoing embodiment, it should be understood by those skilled in the art that various alternatives to the embodiments of the invention described herein may be employed in practicing the invention without departing from the spirit and scope of the invention as defined in the following claims. It is intended that the following claims define the scope of the invention and that the method and system within the scope of these claims and their equivalents be covered thereby. This description of the invention should be understood to include all novel and non-obvious combinations of elements described herein, and claims may be presented in this or a later application to any novel and non-obvious combination of these elements. The foregoing embodiment is illustrative, and no single feature or element is essential to all possible combinations that may be claimed in this or a later application. Where the claims recite "a" or "a first" element of the equivalent thereof, such claims should be understood to include incorporation of one or more such elements, neither requiring nor excluding two or more such elements.

What is claimed is:

1. An electronic device, comprising:
a phase-change material; and
an electrode in electrical communication with said phase-change material, said electrode comprising nitrogenated carbons,
wherein the atomic concentration of carbon in said electrode exceeds the atomic concentration of nitrogen in said electrode.

2. The device of claim 1, wherein said electrode consists essentially of said nitrogenated carbon.

3. The device of claim 1, wherein said phase-change material comprises a chalcogenide material.

4. The device of claim 1, wherein said phase-change material is in direct contact with the nitrogenated carbon of said electrode.

5. An electronic device, comprising:
a chalcogenide material; and
an electrode in electrical communication with said chalcogenide material, said electrode comprising nitrogenated carbons,
wherein the atomic concentration of carbon in said electrode exceeds the atomic concentration of nitrogen in said electrode.

6. The device of claim 5, wherein said electrode consists essentially of said nitrogenated carbon.

7. The device of claim 5, wherein said chalcogenide material is in direct contact with the nitrogenated carbon of said electrode.

8. An electronic device, comprising:
an S-type threshold switching material; and
an electrode in electrical communication with said switching material, said electrode comprising nitrogenated carbon,
wherein the atomic concentration of carbon in said electrode exceeds the atomic concentration of nitrogen in said electrode.

9. An electronic device, comprising:
a programmable resistance material; and
a nitrogenated carbon material in electrical communication with said programmable resistance material wherein the atomic concentration of carbon in said nitrogenated carbon material exceeds the atomic concentration of nitrogen in said nitrogenated carbon material.

10. device of claim 9, wherein said programmable resistance material comprises a phase-change material.

11. device of claim 9, wherein said programmable resistance material comprises a chalcogenide material.

12. device of claim 9, wherein said nitrogenated carbon material is in direct contact with said programmable resistance material.

13. The electronic device of claim 9, wherein carbon is the most prevalent element in said nitrogenated carbon material.

14. An electronic device, comprising:
a chalcogenide material; and
a nitrogenated carbon material in electrical communication with said chalcogenide material, wherein the atomic concentration of carbon in said nitrogenated carbon material exceeds the atomic concentration of nitrogen in said nitrogenated carbon material.

15. device of claim 14, wherein said nitrogenated carbon material is in direct contact with said chalcogenide material.

16. The electronic device of claim 14, wherein carbon is the most prevalent element in said nitrogenated carbon material.

17. An electronic device, comprising:
an S-type threshold switching material; and
a nitrogenated carbon material in electrical communication with said S-type threshold switching material, wherein the atomic concentration of carbon in said nitrogenated carbon material exceeds the atomic concentration of nitrogen in said nitrogenated carbon material.

18. The electronic device of claim 17, wherein carbon is the most prevalent element in said nitrogenated carbon material.

19. An electronic device, comprising:
a phase-change material; and
a first material in communication with said phase-change material, said first material consisting essentially of carbon and nitrogen, wherein the atomic concentration of carbon in said first material exceeds the atomic concentration of nitrogen in said first material.

20. The device of claim 19, wherein said first material comprises a carbon nitride material.

21. The device of claim 19, wherein said phase-change material comprises a chalcogenide material.

22. The device of claim 19, wherein said communication includes electrical communication.

23. The device of claim 19, wherein said communication includes thermal communication.

24. An electronic device, comprising:
a chalcogenide material; and
a first material in electrical communication with said chalcogenide material, said first material consisting essentially of carbon and nitrogen, wherein the atomic concentration of carbon in said first material exceeds the atomic concentration of nitrogen in said first material.

25. The device of claim 24, wherein said first material comprises a carbon nitride material.

26. An electronic device, comprising:
   an S-type threshold switching material; and
   a first material in electrical communication with said switching material, said first material consisting essentially of carbon and nitrogen, wherein the atomic concentration of carbon in said first material exceeds the atomic concentration of nitrogen in said first material.

27. A method of making an electronic device, said method comprising:
   forming a nitrogenated carbon material, the atomic concentration of carbon in said nitrogenated carbon material exceeding the atomic concentration of nitrogen in said nitrogenated carbon material; and
   forming a chalcogenide material, said chalcogenide material being in electrical communication with said nitrogenated carbon material.

28. The method of claim 27, wherein said forming said nitrogenated carbon material comprises the step of mixing nitrogen with vaporized carbon.

29. The method of claim 27, wherein said forming said vaporized carbon is formed by a method comprising the step of contacting a carbon target with an ionized gas, the volume ratio of said nitrogen gas to said ionized gas between from about 30 percent to about 70 percent.

30. The method of claim 27, wherein said forming said nitrogenated carbon material comprises the step of sputtering a target consisting essentially of the elements carbon and nitrogen.

31. The method of claim 27, wherein said forming said chalcogenide material occurs after said forming said nitrogenated carbon material.

* * * * *